United States Patent [19]

Hayakawa et al.

[11] Patent Number: 4,866,473
[45] Date of Patent: Sep. 12, 1989

[54] THERMAL FIXING DEVICE FOR USE IN RECORDING APPARATUS

[75] Inventors: Kiyoharu Hayakawa, Aichi; Yumio Matsumoto, Kasugai; Masashi Ueda, Nagoya; Akira Sago, Nagoya; Osamu Takagi, Nagoya, all of Japan

[73] Assignee: Brother Kogyo Kabushiki Kaisha, Aichi, Japan

[21] Appl. No.: 206,124

[22] Filed: Jun. 13, 1988

[30] Foreign Application Priority Data

Jun. 12, 1987 [JP] Japan .............................. 62-91193[U]

[51] Int. Cl.⁴ ............................................. G03B 27/32
[52] U.S. Cl. ...................................... 355/27; 355/290; 346/25; 226/181
[58] Field of Search ................ 355/27.3 FU; 430/138; 226/181; 346/25, 135.1; 219/216

[56] References Cited

U.S. PATENT DOCUMENTS

| | | | |
|---|---|---|---|
| 3,965,332 | 6/1976 | Thettu .................................. | 219/216 |
| 4,013,871 | 3/1977 | Namiki et al. .................. | 219/216 X |
| 4,315,682 | 2/1980 | Parzanici ........................ | 226/181 X |
| 4,399,209 | 8/1983 | Sanders et al. ...................... | 430/138 |
| 4,416,966 | 11/1983 | Sanders et al. ...................... | 430/138 |
| 4,554,235 | 11/1985 | Adair et al. ......................... | 430/138 |
| 4,562,137 | 12/1985 | Sanders ................................ | 430/138 |
| 4,768,050 | 8/1988 | Beery ................................ | 355/27 X |

FOREIGN PATENT DOCUMENTS 2133899A 1/1984 United Kingdom .

Primary Examiner—L. T. Hix
Assistant Examiner—Brian W. Brown
Attorney, Agent, or Firm—Oliff & Berridge

[57] ABSTRACT

In a thermal fixing device for use in a recording apparatus, an image on a recording medium is thermally fixed while passing through a nip between a pair of rollers. In order to prevent the recording medium from being wound around one of the rollers disposed to contact with the image formed surface of the recording medium, a diameter of that roller is made smaller than a diameter of the remainder, whereby a resilient force of the recording medium produced when the latter is curved along the surface of the smaller diameter roller overcomes an adhesion force that the image formed surface of the recording medium adheres to the smaller diameter roller.

8 Claims, 1 Drawing Sheet

4,866,473

THERMAL FIXING DEVICE FOR USE IN RECORDING APPARATUS

BACKGROUND OF THE INVENTION

The present invention relates to a thermal fixing device for use in a recording apparatus which reproduces an image of character, symbol, pattern or the like on a recording medium.

In a conventional thermal fixing device, a pair of heat rollers has been used for thermally fixing an imaging portion on a recording medium. Since the surface of the heat roller is coated, an adhesion force exerted to the recording medium by the heat roller has been considerabaly weak. And, paper rigidity is large enough to overcome the adhesion force, so that the recording medium is hardly wound around the heat roller even if the size of the roller is relatively large, e.g. about 30 mm in diameter. However, when the thermal fixing is performed with respect to the photosensitive material in melted phase while increasing the temperature of the heat roller, the recording medium tends to be wound around the heat roller due to the adhesion force of the melted material. Once the recording medium is wound therearound, it is troblesome to peel it off from the heat roller.

SUMMARY OF THE INVENTION

The present invention has been made in view of the foregoing disadvantage accompanying the conventional thermal fixing device, and it is an object of the invention to provide an improved thermal fixing device for use in a recording apparatus, in which the recording medium is prevented from being adhered to the heat roller and winding around the heat roller.

In order to achieve the above and other objects of the invention, a thermal fixing device is provided for thermally fixing an imaging portion provided on one surface of a recoding medium in which the imaging portion has adhesivity and the recording medium has rigidity. The device includes a roller means having a cylindrical body rotatable about its axis; a supporting means disposed to intimately contact with the cylindrical body, the recording medium passing between the roller means and the supporting means; and a heating means for heating at least one of the roller means and the supporting means. The cylindrical body is disposed to contact with the one surface of the medium and the cylindrical body has a circular cross-section having a radius of curvature of a predetermined range determined so that linearity orientation of the medium caused by the rigidity thereof can overcome curving orientation of the medium caused by adhesion of the one surface to the cylindrical body.

With the thermal fixing device according to the invention, the radius of curvature of the cylindrical body is small than a radius of curvature of the supporting means so that a force releasing the medium away from the roller means is stronger than the adhesive force produced between the medium and the roller means. Accordingly, the medium is not wound around the roller means but passes through the thermal fixing device.

DETAILED DESCRIPTION OF THE PREFERRED EMBODIMENT

A preferred embodiment of the present invention will now be described with reference to the accompanying drawings. In the embodiment of the invention, it is inteded to use a color reproducible recording medium as disclosed in U.S. Pat. No. 4,399,209 to Sanders et al. The recording medium disclosed therein is of a so-called transfer type which is made up of a photosensitive and pressure-sensitive recording sheet and a developer sheet. The photosensitive and pressure-sensitive recording sheet is made up of a transparent base member made of resin and pressure rupturable microcapsules coated on one surface of the base member, each of the microcapsules separately containing photo-curable resin and one of primary color chromogenic materials or dye precursours, i.e. colors of cyan, magneta and yellow. A latent image is formed on the photosensitive and pressure-sensitive recording sheet, since the microcapsule is sensitive to light in a predetermined wavelength range and a mechanical strength thereof varied when exposed to light. By pressure-rupturing the uncured microcapsules and having the chromogenic material released from the microcapsule react with a developer material coated on the developer sheet, a visible image is formed on the developer sheet. Although the above-described recording medium is intended to be used in the embodiment of the present invention, photosensitive recording mediums of other kinds may also be employed insofar as the thermal fixing is to be carried out.

Figure 1:
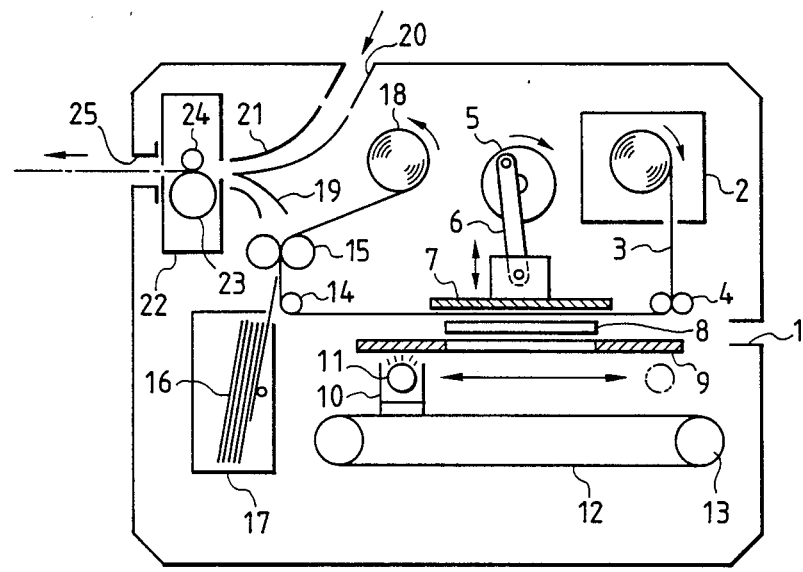
FIG. 1 is a schematic cross-sectional side view showing an image recording apparatus to which a thermal fixing device according to the present invention is applied.

Referring to FIG. 1, an overall arrangement of an image recording apparatus to which the thermal fixing device is applied will be described. An original insertion portion 1 is provided in the right side panel of the recording apparatus, and a sheet discharge portion 25 is provided in the upper portion of the left side panel. A cassette 2 is disposed in the right side upper portion of the recording apparatus, in which a roll of a photosensitive and pressure-sensitive recording sheet 3 is accommodated. Below the cassette 2, a pair of drive rollers 4 is positioned for withdrawing the recording sheet 3 from the cassette 4. A feed roller 14 is disposed leftwardly of the drive rollers 4 in horizontally spaced relation, and a pair of pressure developing rollers 15 is located above the feed roller 14. A takeup roller 18 is disposed upwardly of the pressure developing rollers 15 for winding the recording sheet 3. The recording sheet 3 is therefore supplied from the cassette 2 by the drive rollers 4 and then travels horizontally from the drive rollers 4 to the feed roller 14. The recording sheet 3 then passes through a nip between the pressure developing rollers 15 and is wound around the takeup roller 18.

Above the horizontally extended recording sheet portion between the rollers 4 and 14, a mechanism is disposed for bringing the sheet 3 into intimate contact with an original support member 9 on which an original 8 is placed. The mechanism includes a drive gear 5 rotated by a motor (not shown), a connecting rod 6 having its upper end rotatably secured to an eccentric position of the drive gear 5, and a pressing plate 7 secured to the lower end of the connecting rod 6. In accordance with rotation of the drive gear 5, the pressing plate 7 is lowered by the connecting rod 6 to press the recording sheet 3 and the original 8 against the original support member 9. A central portion of the original support member 9 in which the original 8 is located is made of transparent material, such as glass, to allow a light to pass therethrough.

Below the original support member 9, a light source unit 10 is disposed in which a fluorescent lamp 11 is housed. The light source unit 10 is mounted on an endless belt 12 and is thereby horizontally moved. The endless belt 12 is driven by a pulley 13 which in turn driven by a motor (not shown).

In the left portion of the feed roller 14, a cassette 17 is disposed for accommodating therein a stack of developer sheets 16. A feed roller is provided in the interior of the cassette 17 for feeding the developer sheet 16 one by one toward the pressure developing rollers 15. Above the pressure developing rollers 15, a guide member 19 is disposed for introducing the developer sheet 16 into a thermal fixing device 22 provided in the left side upper portion of the recording apparatus. A developer sheet insertion portion 20 is provided in the upper panel of the recording apparatus, from which a developer sheet 16 can be inserted while being guided by a guide member 21 into the thermal fixing device 22.

Figure 2:
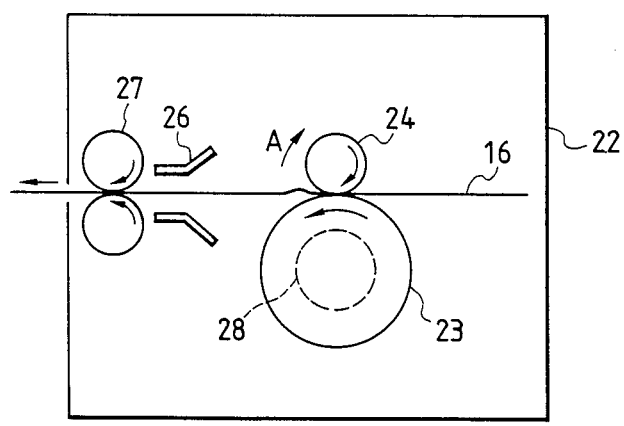
FIG. 2 is an enlarged shematic cross-sectional side view showing the thermal fixing device incorporated in the image recording apparatus in FIG. 1.

In the interior of the thermal fixing device 22, a heat roller 23 and a rubber roller 24 are provided. The diameter of the rubber roller 24 is smaller than that of the heat roller 23. The diameter of the rubber roller 24 is about 15 mm in this embodiment. The developer sheet 16 passed through a nip between the heat roller 23 and the rubber roller 24 is discharged outside the recording apparatus through the discharge portion 25. As shown in FIG. 2, a guide member 26 and a pair of feed rollers 27 may further be provided in the interior of the thermal fixing device 22. The heat roller 23 contains in its central portion a halogen lamp 28 and the heat generated by the halogen lamp 28 is adjustable by means of a thermister. When the imaging portion of the developer sheet 16 contacts with the rubber roller 24, the developer sheet 16 tends to be adhered to the rubber roller 24 and is about to be wound therearound. However, since the rubber roller 24 is small in diameter and the developer sheet 16 is only curved with large radius of curvature, the contacting area of the rubber roller 24 with the developer sheet 16 is reduced. Accordingly, the adhesion force of the developer sheet 16 to the rubber roller 24 is significantly reduced as compared with that in the conventional thermal fixing device in which a large-diameter roller is used. The rigidity of the developer sheet overcomes the adhesion force, so that the developer sheet 16 is after all not wound around the rubber roller 24.

Next, the operation of the recording apparatus will be described in far more detail. The original 8 inserted from the insertion portion 1 is placed in a predetermined position on the original support member 9. When the drive gear 5 rotates in response to the rotation of the motor, the pressing plate 7 is lowered and the original 8 and photosensitive and pressure-sensitive recording sheet 3 are held in intimate contact with each other. Thereafter, the motor for driving the pulley 13 is rotated, so that the light source unit 10 mounted on the endless belt 12 is moved from left to right or vice versa while exposing the recording sheet 3 to light through the original 8 on line basis. After the exposure, the pressing plate 7 is elevated to release the contact of the recording sheet 3 with the original 8 and then the recording sheet 3 is transported by means of the feed roller 14 and the winding roller 18. When the exposed area of the recording sheet 3 moves past the feed roller 14 and reaches the pressure developing rollers 15, the developer sheet 16 is delivered from the cassette 17 and superposed on the exposed area of the recording sheet 3. The sheets 3 and 16 are then pressed together by the pressure developing rollers 15 to transfer an image from the sheet 3 to the sheet 16 while developing a latent image into a visible image. Thereafter, the recording sheet 3 is separated from the developer sheet 23 and wound up by the takeup roller 18. The developer sheet 16 with the developed image thereon is fed into the thermal fixing device 22 through the guide member 19.

In the thermal fixing device 22, the developer sheet 16 passes at a speed of about 14 mm/second through the nip between the heat roller 23 heated up to an appropriate temperature (about 120 C. according to this embodiment) and the rubber roller 24, whereby the developed image is thermally fixed. Since the surface of the developer sheet 16 on which the developed imaged is formed confronts the rubber roller 24, the developer sheet 16 tends to be adhered to the rubber roller 24. However, since the rubber roller 24 is small in diameter, the rigidity of the developer sheet 16 overcomes the adhesion force. As a result, although slightly bent as shown in FIG. 2, the developer sheet 16 is not wound around the rubber roller 24 but fed into a nip between the feed rollers 27 through the guide member 26. The developer sheet 16 is then discharged outside the recording apparatus from the discharge opening 25.

When it is desired that only a thermal fixing be carried out, a developer sheet 16 is inserted from the insertion opening 20 while putting the image formed surface of the developer sheet in face-up. The inserted developer sheet 16 passes through the guide member 21 and introduced into the thermal fixing device 22. The thermal fixing is carried out in the similar fashion as described above, whereupon the sheet is discharged outside the recording apparatus from the discharge opening 25.

While the present invention has been described with reference to a specific embodiment, it should be understood that the present invention is not limited thereto but a variety of changes and modifications may be made without departing from the scope and spirit of the invention. For example, although the description has been given under the situation that the recording medium as disclosed in U.S. Pat. No. 4,399,209 is employed, the photosensitive and pressure-sensitive recording sheet may be of the kind that the microcapsules coated thereon are initially in cured state and are changed to a softened state when exposed to a light. The recording apparatus to which the thermal fixing device of the invention is applied may be of the type in which a unit including the light source and a developing portion is separately provided from a unit including the thermal fixing portion, or of the type in which the light source, the developing portion and the thermal fixing portion are provided in the same unit. A heat radiating plate and an air introducing window may additionally be provided in conjunction with the thermal fixing device in order to prevent the temperature rise in the interior of the thermal fixing device. Moreover, the heat roller may be of small in diameter, or in lieu of the heat roller, a plane-shape heater may be used.

As can be appreciated from the foregoing description, since the roller disposed to be in facial contact with the image face of the sheet is made to be small in diameter, it is advantageous in that the sheet is not would around the heat roller.

What is claimed is:

1. A thermal fixing device for thermally fixing an imaging portion provided on one surface of a recording medium, said imaging portion having adhesivity and said recording medium having rigidity, said device comprising: a roller means having a cylindrical body rotatable about its axis; a supporting means disposed to intimately contact with said cylindrical body, said recording medium passing between said roller means and said supporting means; and a heating means for heating at least one of said roller means and said supporting means, wherein said cylindrical body is disposed to contact with said one surface of said medium and wherein said cylindrical body has a circular cross-section having a radius of curvature of a predetermined range determined so that linearity orientation of said medium caused by said rigidity thereof can overcome curving orientation of said medium caused by adhesion of said one surface to said cylindrical body.

2. A thermal fixing device as claimed in claim 1, wherein said radius of curvature of said cylindrical body is smaller than a radius of curvature of said supporting means.

3. A thermal fixing device as claimed in claim 2, further comprising an adjusting means coupled to said heating means for adjusting a temperature of said heating means.

4. A thermal fixing device as claimed in claim 3, wherein said adjusting means is a thermister.

5. A thermal fixing device as claimed in claim 4, further comprising a guide means disposed in downstream of said roller means and said supporting means for guiding said medium to be transported in a predetermined direction.

6. A thermal fixing device as claimed in claim 5, further comprising a feeding means disposed in downstream of said guide means for feeding said medium.

7. A thermal fixing device as claimed in claim 6, wherein said cylindrical body is made of rubber.

8. A thermal fixing device as claimed in claim 1, wherein said medium is a developer sheet having a surface coated with a developer material and said adhesive material is a chromogenic material which reacts with said developer material, thereby forming a visible image on said developer sheet.

* * * * *